US012627032B2

(12) United States Patent
Coffy et al.

(10) Patent No.: US 12,627,032 B2
(45) Date of Patent: May 12, 2026

(54) INTEGRATED ELECTRONIC DEVICE FOR THE TRANSMISSION/RECEPTION OF A RADIO FREQUENCY WAVE

(71) Applicant: STMicroelectronics International N.V., Geneva (CH)

(72) Inventors: Romain Coffy, Voiron (FR); Laurent Schwartz, La Buisse (FR); Ludovic Fourneaud, Saint Vincent de Mercuze (FR)

(73) Assignee: STMicroelectronics International N.V., Geneva (CH)

( * ) Notice: Subject to any disclaimer, the term of this patent is extended or adjusted under 35 U.S.C. 154(b) by 178 days.

(21) Appl. No.: 18/526,427

(22) Filed: Dec. 1, 2023

(65) Prior Publication Data

US 2024/0186679 A1     Jun. 6, 2024

(30) Foreign Application Priority Data

Dec. 2, 2022     (FR) ...................................... 2212675

(51) Int. Cl.
| | |
|---|---|
| *H01Q 1/22* | (2006.01) |
| *H05K 1/02* | (2006.01) |
| *H10W 74/01* | (2026.01) |
| *H10W 74/10* | (2026.01) |
| *H10W 90/00* | (2026.01) |

(52) U.S. Cl.
CPC ......... *H01Q 1/2283* (2013.01); *H05K 1/0237* (2013.01); *H10W 74/01* (2026.01); *H10W 74/114* (2026.01); *H05K 2201/10098* (2013.01); *H10W 90/724* (2026.01)

(58) Field of Classification Search
CPC ........... H01L 21/56; H01L 2224/16225; H01L 23/3121; H01L 24/16; H01Q 1/2283; H01Q 1/3233; H05K 1/0237; H05K 2201/10098
See application file for complete search history.

(56) References Cited

U.S. PATENT DOCUMENTS

| | | |
|---|---|---|
| 2020/0365971 A1 | 11/2020 | Moallem et al. |
| 2021/0050312 A1* | 2/2021 | Franson ............ H01L 23/49816 |
| 2021/0056374 A1* | 2/2021 | Lotya ....................... H04B 5/77 |

(Continued)

OTHER PUBLICATIONS

INPI Search Report and Written Opinion for priority application, FR 2212675, report dated Nov. 23, 2023, 9 pgs.

*Primary Examiner* — Thien M Le
(74) *Attorney, Agent, or Firm* — Crowe & Dunlevy LLC

(57) ABSTRACT

A waveguide has a first input/output for receiving/outputting a radio frequency (RF) wave and guiding the RF wave between the first input/output and a second input/output. An electronic integrated circuit chip is electrically connected at a front face to a metal level of a carrier substrate which includes a patch antenna. An electrically insulating embedding material surrounds the electronic chip and is disposed between the patch antenna and the first input/output of the waveguide which is at least in contact with the embedding material. The electronic chip cooperates electrically with the patch antenna so as to cause the patch antenna to transmit the RF wave to the first input/output through the embedding material. The electronic chip also processes an electrical signal from the patch antenna in response to the patch antenna receiving the radio frequency wave output by the first input/output via the embedding material.

17 Claims, 8 Drawing Sheets

(56)  References Cited

U.S. PATENT DOCUMENTS

| | | | |
|---|---|---|---|
| 2021/0192311 A1* | 6/2021 | Lotya | G06K 19/07747 |
| 2021/0359387 A1 | 11/2021 | Hartner et al. | |
| 2021/0382135 A1* | 12/2021 | Hess | G01S 7/028 |
| 2022/0068828 A1 | 3/2022 | Vincent et al. | |
| 2022/0192030 A1* | 6/2022 | Sokol | B22F 10/64 |
| 2022/0335265 A1* | 10/2022 | Osborn | G06K 19/07705 |
| 2023/0027226 A1* | 1/2023 | Lotya | G06K 19/02 |
| 2023/0103039 A1* | 3/2023 | Guo | H04B 1/0057 |
| | | | 455/78 |
| 2024/0079759 A1* | 3/2024 | Chua | H01Q 1/2283 |
| 2025/0139400 A1* | 5/2025 | Ng | H01L 23/49855 |
| 2025/0239570 A1* | 7/2025 | Elsherbini | H01L 23/49822 |

* cited by examiner

INTEGRATED ELECTRONIC DEVICE FOR THE TRANSMISSION/RECEPTION OF A RADIO FREQUENCY WAVE

PRIORITY CLAIM

This application claims the priority benefit of French Application for Patent No. 2212675, filed on Dec. 2, 2022, the content of which is hereby incorporated by reference in its entirety to the maximum extent allowable by law.

TECHNICAL FIELD

Embodiments and implementations relate to integrated electronic devices capable of transmitting/receiving a radio frequency wave or signal that has, for example, a frequency above 50 GHz, for example 63 GHz or more.

Such devices can be applied to the 5G domain and be used in, for example, but not limited to the automotive field, in particular within on-board radars in motor vehicles.

Currently, such devices comprise an electronic chip whose front face is connected to a rear face of a laminate substrate, the chip also being embedded in a resin layer.

The front face of the laminate substrate includes a patch antenna and is connected to a rear face of a printed circuit board.

A first waveguide is formed in the printed circuit board facing the antenna and a second waveguide, aligned with the first, is separate and fixed onto the front face of the printed circuit board.

In some cases, a heat sink is fixed onto the rear face of the resin layer to facilitate the heat dissipation of the device during operation thereof.

Such a device structure is complex to produce, especially in terms of waveguide and antenna alignment, has a relatively large height and has a high manufacturing cost.

There is therefore a need to propose a device that aims to remedy the aforementioned drawbacks.

There is therefore a need for a more compact, integrated device that is easier to produce.

SUMMARY

According to one aspect, an integrated electronic device comprises: a waveguide having a first input/output for receiving/outputting a radio frequency wave that has, for example, a frequency above 50 GHz, and that is configured to guide this radio frequency wave from the first input/output to a second input/output or from the second input/output to the first input/output; an electronic chip including a front face electrically connected to a metal level of a carrier substrate which includes a patch antenna system, said electronic chip being surrounded by an electrically insulating embedding material disposed between the patch antenna system and the first input/output of the waveguide which is at least in contact with said embedding material; the electronic chip being configured to cooperate electrically with the patch antenna module so as to cause the patch antenna system to transmit said radio frequency wave to the first input/output through the embedding material or so as to process an electrical signal from the patch antenna system resulting from the patch antenna system receiving the radio frequency wave output by the first input/output via the embedding material.

The thickness of the embedding material through which the radio frequency wave is intended to travel is advantageously chosen according to the frequency of the radio frequency wave.

According to an alternative to this aspect, the waveguide is an element that is fixed at least onto said embedding material, for example by means of an adhesive.

According to one embodiment of this aspect: the embedding material forms a layer having a top face onto which a first metal part of the waveguide including the first input/output is fixed; the electronic chip has a rear face located in the same plane as the top face of the embedding layer; and the waveguide includes a second metal part fixed onto the rear face of the chip.

The waveguide thus also performs a heat dissipation function in this case.

According to one embodiment of this alternative: the carrier substrate is a laminate substrate including a stack of a plurality of metal levels separated by dielectric layers, the chip is connected to the metal level, referred to as the metal level 1, located the closest to the embedding material; and the patch antenna system includes an antenna element located on the metal level 1 facing the first input/output of the waveguide and electrically connected to the chip by a metal track.

According to another alternative to this aspect, the integrated device is integrally manufactured using Molded Integrated Substrate (MIS) technology that is well known to a person skilled in the art.

Thus, according to one such alternative: the carrier substrate is of the molded integrated substrate (MIS) type, including a stack of metal levels separated by dielectric layers of the molding resin type, the stack including a top level referred to as the metal level 1 to which the electronic chip is connected; the patch antenna system includes an antenna element located on the metal level 1 facing the first input/output of the waveguide and electrically connected to the chip by a metal track; the embedding material is also of the molding resin type (the molding resin can have a composition that is different to that of the carrier substrate, and can be typically adapted to the transmission of the radio frequency wave) and embeds the electronic chip with the exception of its rear face opposite its front face; and the waveguide includes a first metal part including the first input/output and in contact with the embedding material, a second metal part in contact with the rear face of the chip, and an inner volume containing a dielectric material also of the molding resin type (which can be identical to that forming the embedding material).

The use of MIS technology allows the integrated device to be made even more compact and allows the composition of the different molding resins to be easily adapted to their location in the device, where necessary.

As mentioned hereinabove, regardless of the alternative considered, the device can be configured to transmit/receive the radio frequency wave with a frequency above 50 GHz, for example with a frequency of 63 GHz or 77 GHz.

According to another aspect, a method for manufacturing an integrated electronic device comprises: forming a carrier substrate including a stack of metal levels separated by dielectric layers and a patch antenna system; electrically connecting a front face of an electronic chip to a metal level of the substrate, and electrically connecting the chip with the patch antenna system; forming an electrically insulating embedding material surrounding the electronic chip; and forming a waveguide having a first input/output for receiving/outputting a radio frequency wave from/to the patch antenna system via the embedding material disposed between the patch antenna system and the first input/output of the waveguide, the waveguide being configured to guide this radio frequency wave from the first input/output or a second input/output to the second input/output or the first input/output.

The thickness of the embedding material through which the radio frequency wave is intended to travel is advantageously chosen according to the frequency of the radio frequency wave.

A frequency greater than or equal to 50 GHz can be chosen.

According to an alternative to this further aspect, the formation of the waveguide comprises fixing this waveguide at least onto said embedding material.

According to one implementation of this alternative: the chip has a rear face opposite the front face; the formation of the embedding material comprises forming a layer of this material having a top face that lies in the same plane as the rear face of the chip; and the formation of the waveguide comprises fixing, onto the top face of the layer of the embedding material, a first metal part of the waveguide including the first input/output, and fixing, onto the rear face of the chip, a second metal part of the waveguide.

According to one implementation of this alternative: the carrier substrate is a laminate substrate, and the chip is connected to the metal level, referred to as the metal level 1, located the closest to the embedding material; and the patch antenna system includes an antenna element located on the metal level 1 facing the first input/output of the waveguide, and this antenna element is electrically connected to the chip by a metal track.

According to another alternative to this further aspect, the formation of the carrier substrate, the formation of the embedding material surrounding the chip and the formation of the waveguide comprise using a manufacturing technology of the molded integrated substrate type (MIS technology) including: steps of growing metal on molding resin-type layers; steps of covering the metal layers thus formed with other molding resin-type layers; steps of thinning these other molding resin-type layers; and optionally repeating, one or more times, at least some of these steps.

According to one implementation: the formation of the carrier substrate comprises forming the stack of metal levels separated by dielectric layers of the molding resin type, the stack including a top level referred to as the metal level 1 to which the front face of the electronic chip is connected; the patch antenna system includes an antenna element located on the metal level 1 facing the first input/output of the waveguide, and this antenna element is electrically connected to the chip by a metal track; the formation of the embedding material includes surrounding the electronic chip with a material that is also of the molding resin type, with the exception of the rear face of the chip opposite the front face thereof; and the formation of the waveguide includes forming a first metal part including the second input/output and in contact with the embedding material, a second metal part in contact with the rear face of the chip, and forming, within an inner volume of the waveguide, a dielectric material also of the molding resin type.

According to a further aspect, the invention proposes an integrated device obtained by the method according to any of the aforementioned alternatives.

BRIEF DESCRIPTION OF THE DRAWINGS

Other advantages and features of the invention will become apparent upon examining the detailed description of non-limiting embodiments and implementations, and from the accompanying drawings in which.

DETAILED DESCRIPTION

Figure 1:
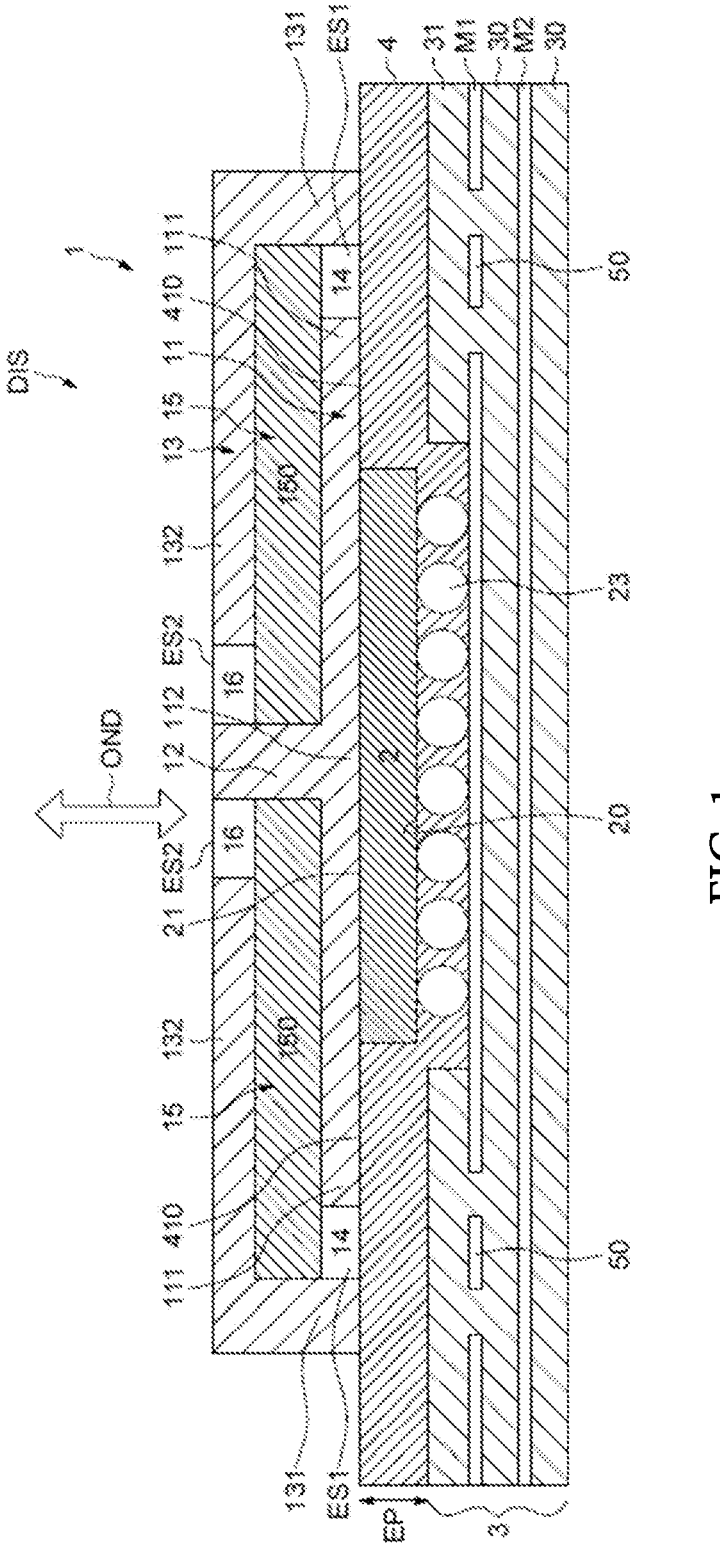
FIG. 1 illustrates a cross-section of an integrated electronic device for transmitting or receiving an electromagnetic radio frequency wave.

In FIG. 1, the reference 'DIS' refers to an integrated electronic device for transmitting or receiving an electromagnetic radio frequency wave OND that has a frequency typically above 50 GHz, for example a frequency of 63 GHz or 77 GHz.

The device DIS comprises a waveguide 1, an electronic integrated circuit chip 2 and a carrier substrate 3.

In this case, this carrier substrate 3 is a laminate substrate having a conventional structure that is well known to a person skilled in the art.

More specifically, this carrier substrate 3 includes a stack of a plurality of metal levels (only two levels M1 and M2 are shown here for simplification purposes) separated by dielectric layers 30.

The metal levels include metal tracks, for example copper tracks, and the dielectric layers include, for example, an epoxy resin, optionally with glass fibers.

It should also be noted that the dielectric layer 31 of the carrier substrate 3, which covers the metal level M1, is a thinner dielectric layer than the dielectric layers 30 and is commonly referred to by a person skilled in the art as a solder mask.

The device DIS further includes a patch antenna system, which name is well known to a person skilled in the art, or planar antenna, including an antenna element 50 located at the metal level M1 which is the top metal level closest to the top face of the substrate 1, also referred to as the "metal level 1".

Figures 2, 3:
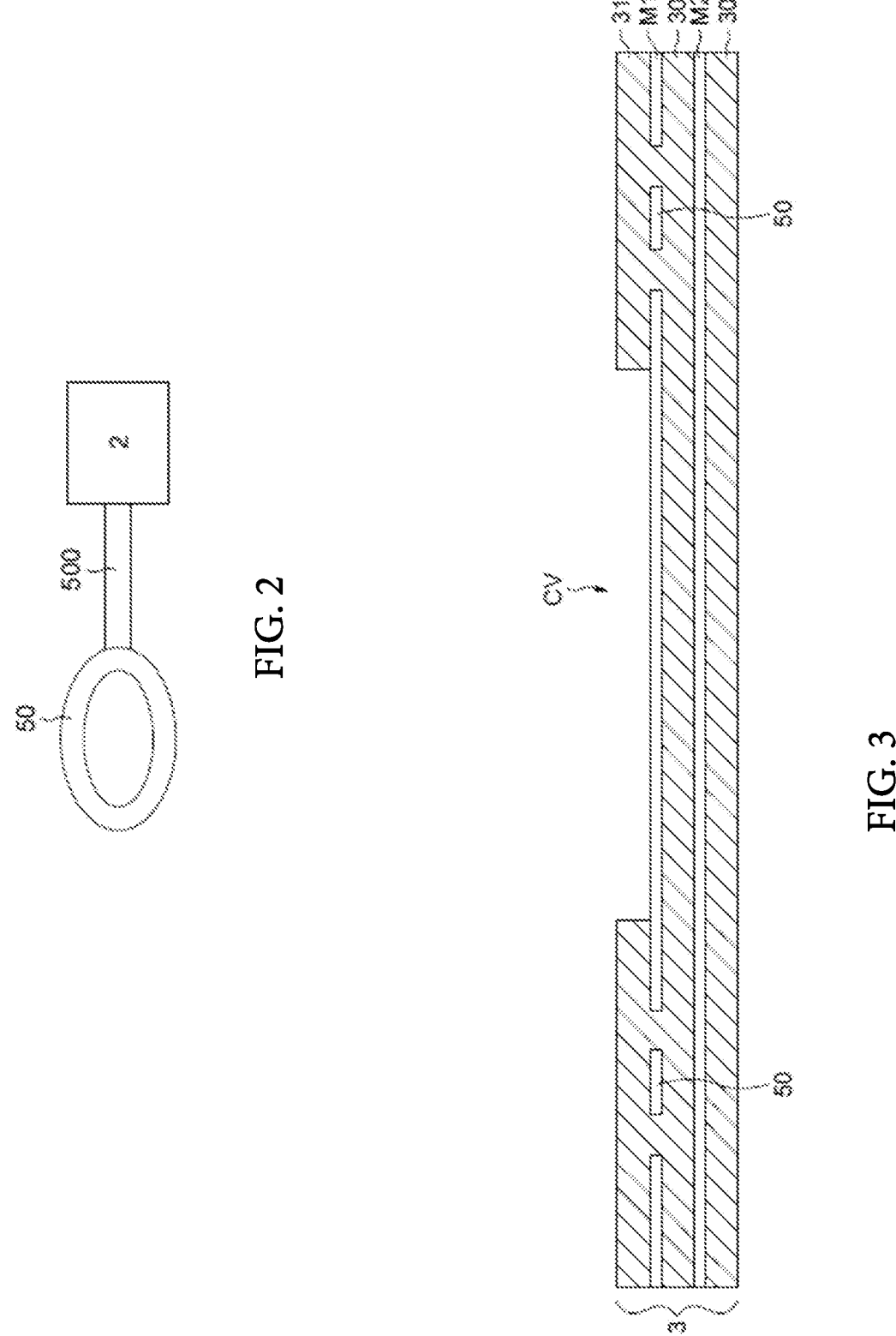
FIG. 2 diagrammatically illustrates an antenna connected to a chip.
FIG. 3 to FIG. 6 illustrate steps in an implementation of a method for manufacturing a device according to FIG. 1.

As illustrated in a very diagrammatic manner in FIG. 2, this antenna element 50 is, in this case, a circular, annular element. However, it could also take any other shape, for example it could be a rectangular, annular element. It need not be annular and could be, for example, a solid element of any shape.

This antenna element 50 is electrically connected to the integrated circuit chip 2 via a metal track 500 located at the metal level M1.

The metal level M2 can include a ground plane for the patch antenna system.

The chip 2 is mounted upside down (i.e., in flip-chip orientation) on the metal level M1.

In other words, the front face 20 of the chip 2 is connected in this case to metal tracks of the metal level M1 by metal connection balls 23, and the chip 2 and the connection balls 23 are embedded in an embedding material 4, for example a molding resin.

In the example embodiment shown in FIG. 1, the molding resin 4 forms a layer surrounding the electronic chip 2, leaving the rear face 21 of this chip 2 exposed. The resin layer 4 has a top face 410 which is located, in this case, in the same plane as the rear face 21 of the chip.

The waveguide 1 includes a metal bottom part 11, for example in the form of a disc. This bottom part includes a first part 111 resting on the top face 410 of the resin layer 4 and a second part 112 resting on the rear face 21 of the chip 2.

The waveguide thus also performs a heat dissipation function, particularly due to the contact between the second metal part 112 and the rear face of the chip.

The waveguide 1 further includes an outer metal part 13 including a vertical cylindrical wall 131 and a top wall 132 that is, for example, disc-shaped.

Alternatively, the bottom wall 11 and the top wall 132 could be rectangular.

The vertical wall 131 also rests on the embedding layer 4.

Finally, the waveguide 1 includes, in this example, a vertical central part 12 connected to the second part 112 and having a free end located in the aperture provided by the top wall 132.

The annular volume 14 of the waveguide, delimited by the vertical wall 131 and the bottom part 11 of the waveguide is, in this case, filled with air but could be filled with another dielectric material that is, for example, identical to the dielectric material 150 contained in the volume 15 delimited by the vertical wall 131, the top wall 132, the bottom wall 11 and the central vertical wall 12.

By way of example, this dielectric material 150 can be a molding resin, air or Teflon for example.

The volume 16 of the waveguide, delimited by the aperture of the top wall 132 and the end of the vertical wall 12, is also filled with air in this case.

The aperture of the waveguide delimited by the bottom part 11 and the bottom part of the vertical wall 131 forms a first input/output interface ES1, whereas the aperture delimited by the top wall 132 and the end of the vertical wall 12 forms a second input/output ES2.

Thus, the waveguide 1 is configured to guide the electromagnetic radio frequency wave OND between the first input/output ES1 and the second input/output ES2 and vice-versa.

More specifically, during operation, when a processing circuit of the chip 2 (not explicitly shown here) transmits an electrical signal to the antenna element 50, the latter radiates and transmits the electromagnetic radio frequency wave that passes through the embedding layer 4, enters the waveguide through the first input/output ES1, is guided within the waveguide 1 and emerges through the second input/output ES2.

Conversely, when the wave OND is received by the second input/output ES2, it is guided within the waveguide 1 to emerge through the first input/output ES1, then passes through the embedding 2 and is received by the antenna element 50 which thus transmits a corresponding electrical signal to the processing circuit of the chip 2.

A person skilled in the art will know how to choose the composition of the embedding resin 4 so that it can easily allow the electromagnetic wave OND to pass.

As a non-limiting example, an embedding resin of the epoxy resin type can be chosen, for example, which contains silica fillers integrated into the mass of the epoxy matrix, for example that marketed by the Japanese company Sumitomo.

Furthermore, the thickness EP of the embedding resin layer 4 is advantageously chosen as a function of the frequency of the electromagnetic wave OND.

A person skilled in the art will know how to adjust this thickness EP as a function of the frequency chosen.

By way of example, the thickness EP can be in the order of 300 to 400 micrometers for a wave frequency of 77 GHz. It can be in the order of 550 microns for a frequency of 63 GHZ.

The lower the frequency of the wave, the greater the thickness EP will be.

The waveguide 1 can have any cross-sectional shape (circular or rectangular) and the antenna element 50 and the cross-section of the waveguide 1 do not necessarily have the same shape, even though the waveguide, which is bonded to the substrate 3, is aligned opposite on the antenna element 50.

Moreover, the second input/output interface ES2 can be extended by a connector or another waveguide or another antenna element within another waveguide.

Furthermore, although in the example shown in FIG. 1, the waveguide has vertical and horizontal parts, it is entirely possible to have only verticality, i.e., a waveguide that will radiate along an axis perpendicular to the antenna element 50 in the continuation of this antenna element.

Reference is now made in particular to FIGS. 3 to 6 to describe an implementation of a method for manufacturing a device which in particular allows the device in FIG. 1 to be obtained.

As shown in FIG. 3, the carrier substrate 3 is firstly formed.

Such a formation is well known per se to a person skilled in the art.

In this case, where only two metallization levels M1 and M2, for example made of copper, are shown for simplification purposes, the bottom dielectric layer is firstly formed of epoxy resin, into which glass fibers are optionally added, then the metallization level M2 is formed.

The dielectric layer covering the metallization level M2 is then formed, followed by the metallization level M1, which includes in particular the formation of the antenna element 50.

In a conventional manner known per se, the metal levels M1 and M2 can be laminated over the "full wafer" on the underlying dielectric layer and then etched to obtain the tracks of these levels and the antenna element. Alternatively, the tracks and the antenna element could be obtained, for example, by electrolytic copper growth.

Figure 4:
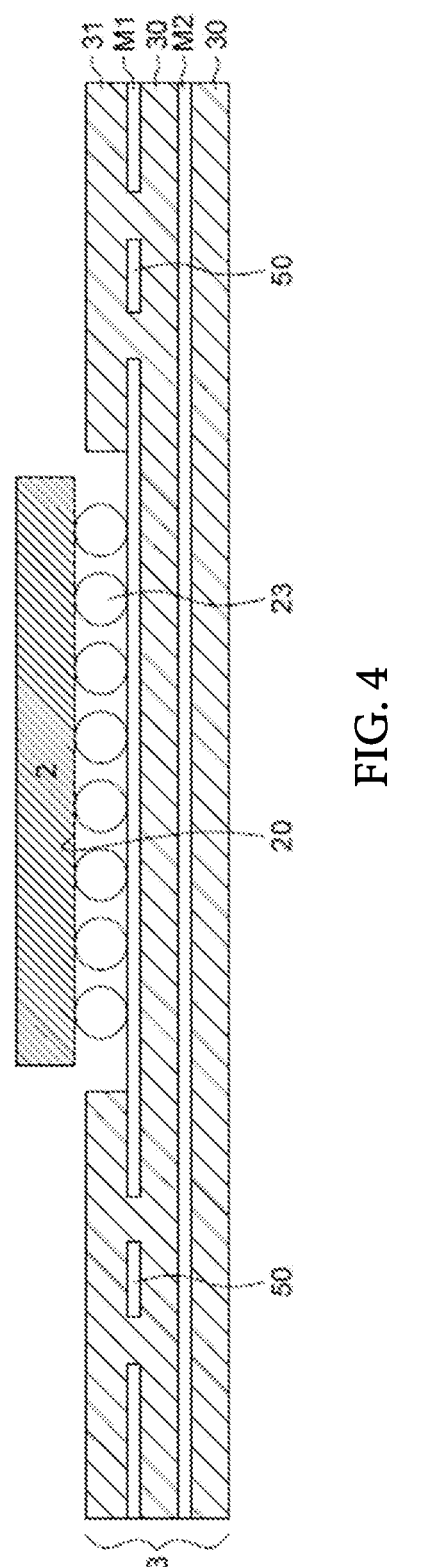

The metallization level M1 is then partially covered by the dielectric layer 31 ("solder mask") so as to form a cavity CV, as shown in FIG. 3, in which, as shown in FIG. 4, the chip 2 is positioned upside-down (flip-chip) with its front face 20 towards the metallization level M1.

The connection balls 23 are soldered to the metal tracks of the metal level M1.

Figure 5:
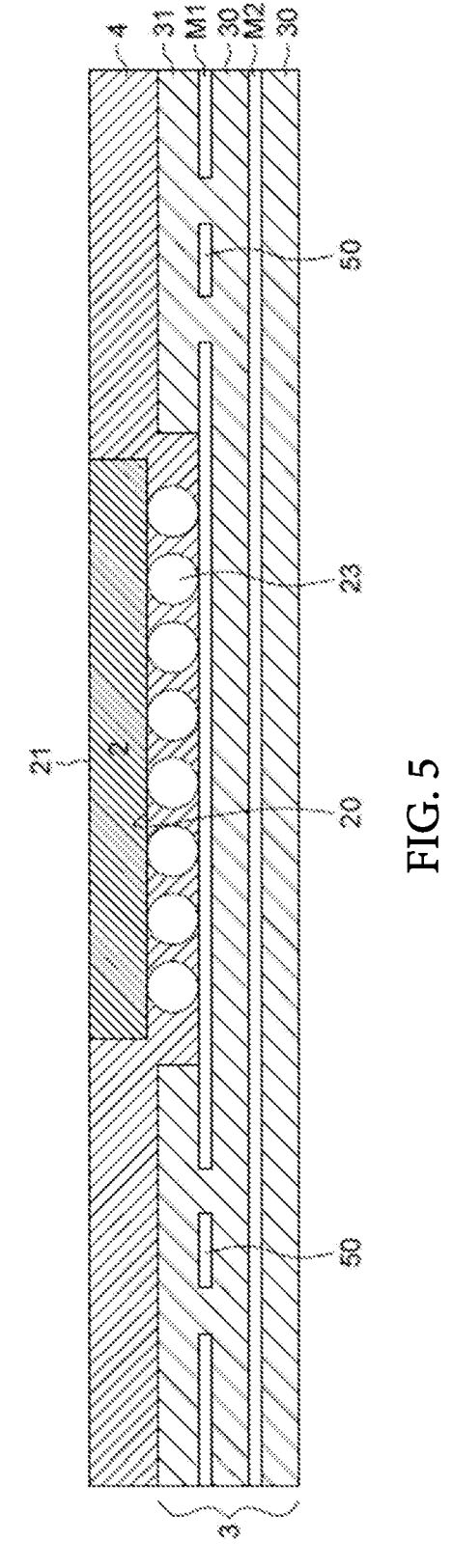

Then, as shown in FIG. 5, the electronic chip 2 and the connection balls 23 are embedded with the embedding resin 4 in a conventional manner known per se. Once the molding resin has solidified, this resin is thinned, for example by chemical-mechanical polishing, so as to form the resin layer 4 which surrounds the chip 2, leaving the rear face 21 of this chip 2 exposed.

Figure 6:
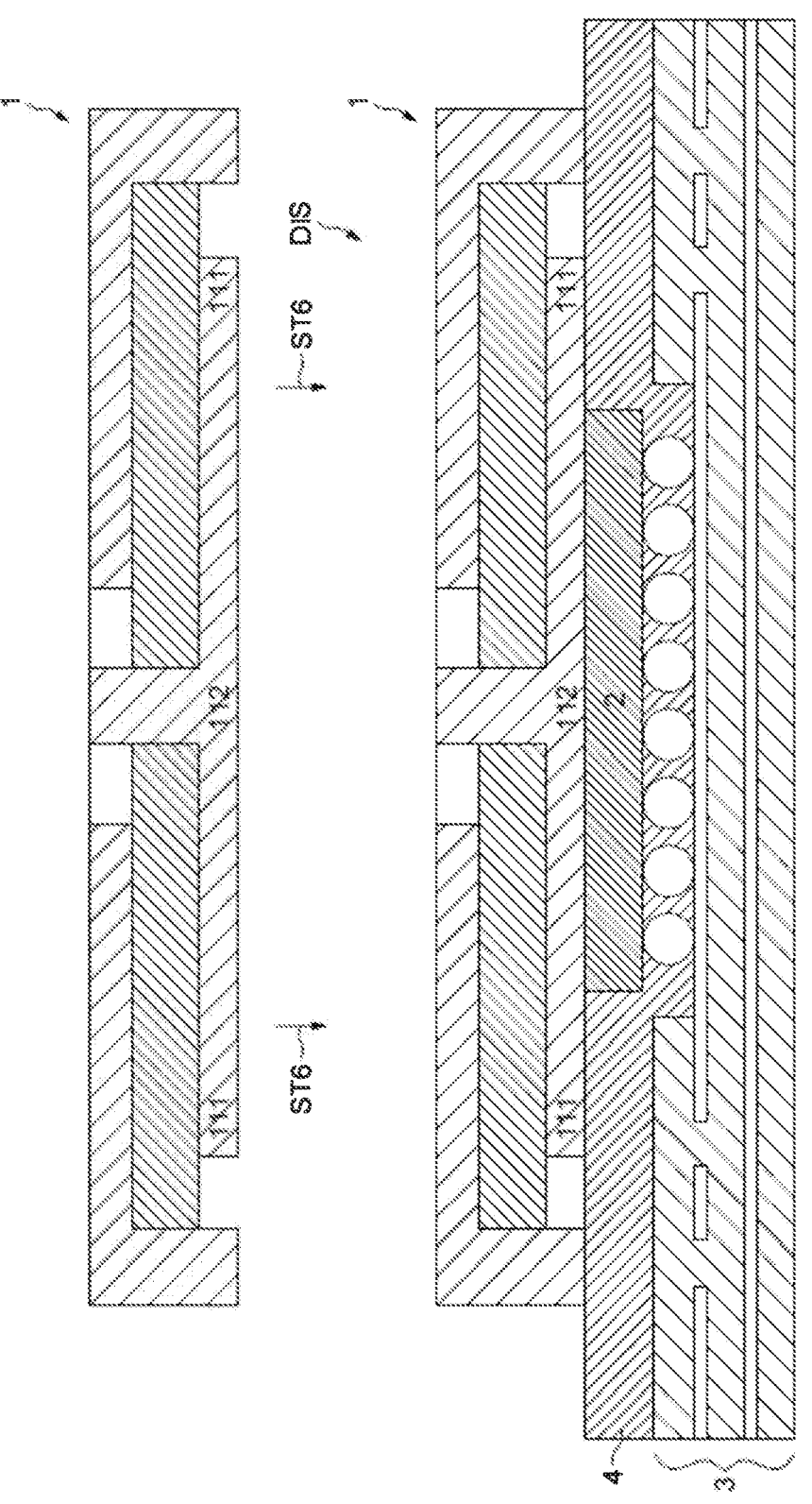

Then, as shown in FIG. 6, the waveguide 1 is provided as a separately manufactured, discrete component and the waveguide 1 is bonded to the embedding resin layer 4 and to the rear face of the chip 2 in a step ST6. This bonding is carried out by means of a conventional adhesive, for example a thermally conductive adhesive.

Figure 7:
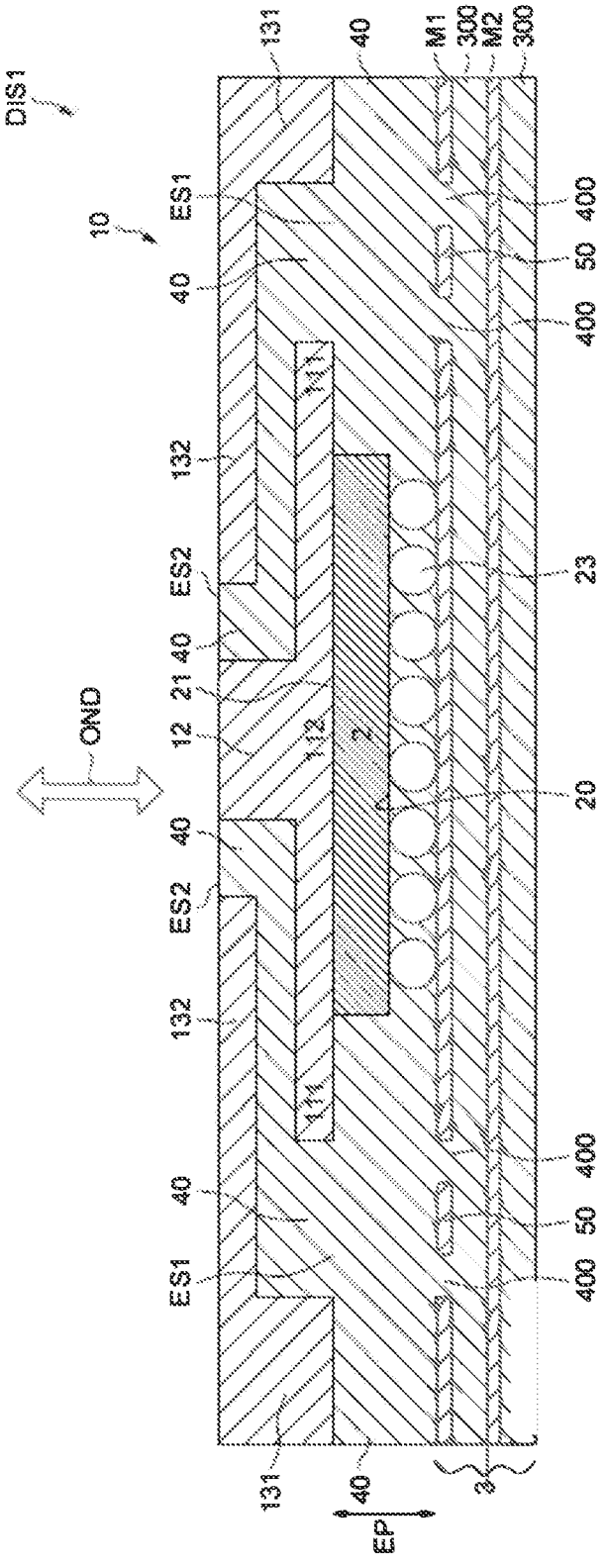
FIG. 7 illustrates an integrated device for transmitting/receiving an electromagnetic wave.

Reference will now be made in particular to FIG. 7 to describe an integrated device DIS1 for transmitting/receiving an electromagnetic wave OND, according to an alternative embodiment.

As will be explained in more detail hereinbelow, the device DIS1 differs from the device DIS in FIG. 1 in particular in that the formation of the carrier substrate, the formation of the embedding material surrounding the chip and the formation of the waveguide comprise the use of a molded integrated substrate (MIS) manufacturing technology.

The elements of the device DIS1, shown in FIG. 7, having structures and/or functions similar to those of elements of the device DIS shown in FIG. 1, bear the same references as these elements shown in FIG. 1, and will not all be described with reference to this FIG. 7.

The differences between FIG. 7 and FIG. 1 will now be described.

The carrier substrate 3A of the device DIS1 is, in this case, a carrier substrate of the molded integrated substrate (MIS) type including a stack of metal levels M1, M2 (again only two metal levels are shown for simplification purposes) separated by dielectric layers 300 of the molding resin type.

The stack of metal levels includes a top level referred to as the metal level M1 or metal level 1, which includes the antenna element 50, and to which the electronic chip 2 is connected via the connection balls 23.

Again, the patch antenna system includes the antenna element 50 located on the metal level 1 M1 facing the first input/output ES1 of the waveguide, electrically insulated by parts 400 of molding resin, and is electrically connected to the chip by a metal track.

The embedding material 40 is also of the molding resin type. However, although it is also of the molding resin type, the molding resin 40 can have a different composition from the molding resin forming the dielectric layers 300. More specifically, this molding resin 40 is particularly suitable for transmitting the electromagnetic wave.

Again, the embedding material 40, of the molding resin type, embeds the electronic chip 20 and the connection balls 23 with the exception of the rear face 21.

The molding resin 40 can, for example, be identical to the resin 4 used in the device DIS in FIG. 1.

Furthermore, as for the device DIS in FIG. 1, the thickness EP of the embedding resin layer 40 is advantageously chosen as a function of the frequency of the electromagnetic wave OND.

The waveguide 10 again includes the first metal part 111 including the first input/output ES1 in contact with the embedding material 40 and the second metal part 112 in contact with the rear face 21 of the chip so as to facilitate the heat dissipation of the chip during operation thereof.

Furthermore, the inner volume of the waveguide contains a dielectric material also of the molding resin type which can also be the material 40.

This is particularly advantageous because in this case, there is no discontinuity between the embedding material 40 surrounding the chip 2 and the dielectric material 40 located inside the waveguide 10.

Figure 8:
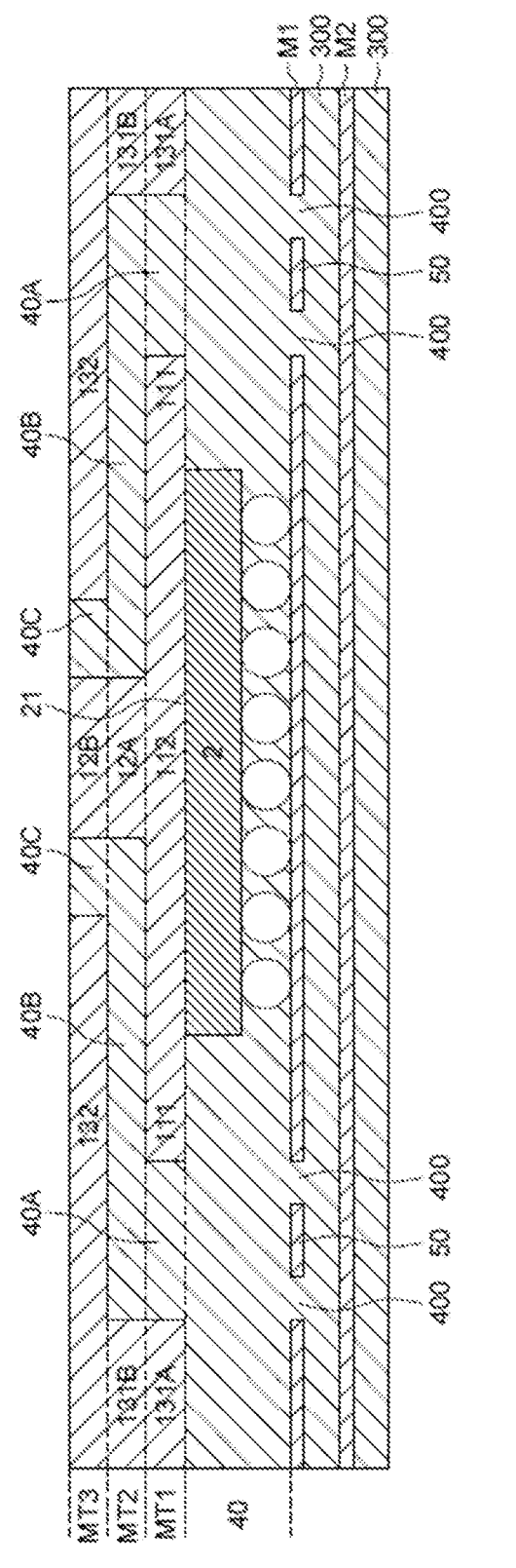
FIG. 8 to FIG. 10 illustrate steps in an implementation of a method for manufacturing a device according to FIG. 7.
Figure 9:
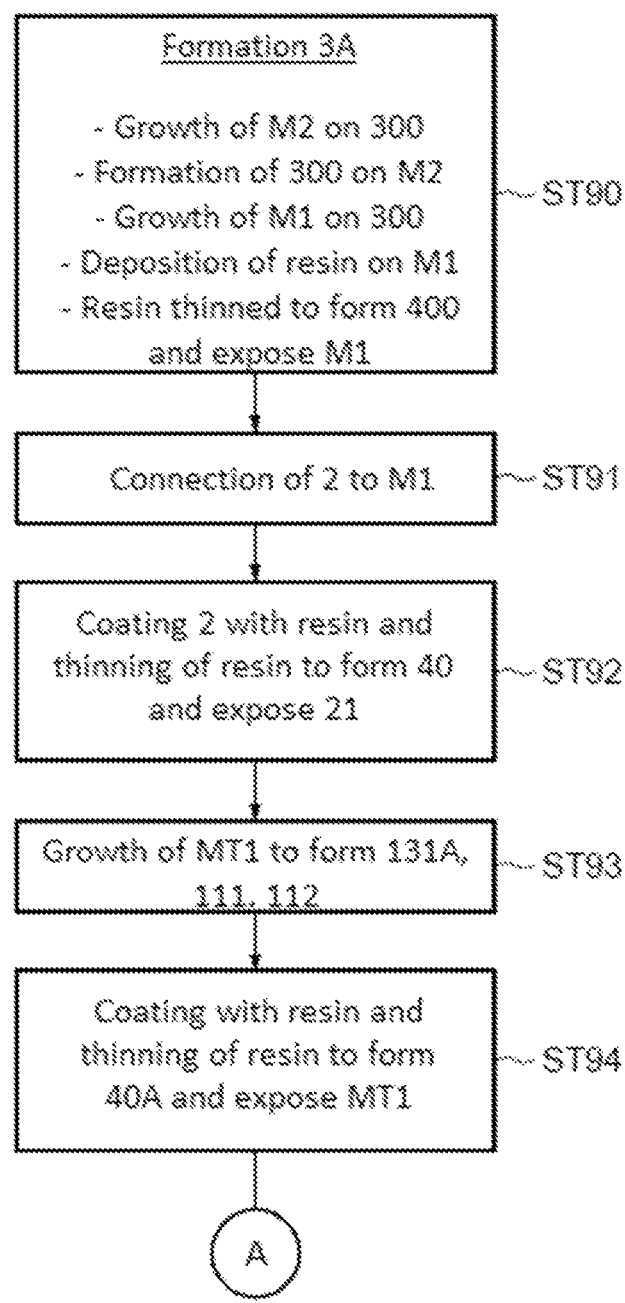
Figure 10:
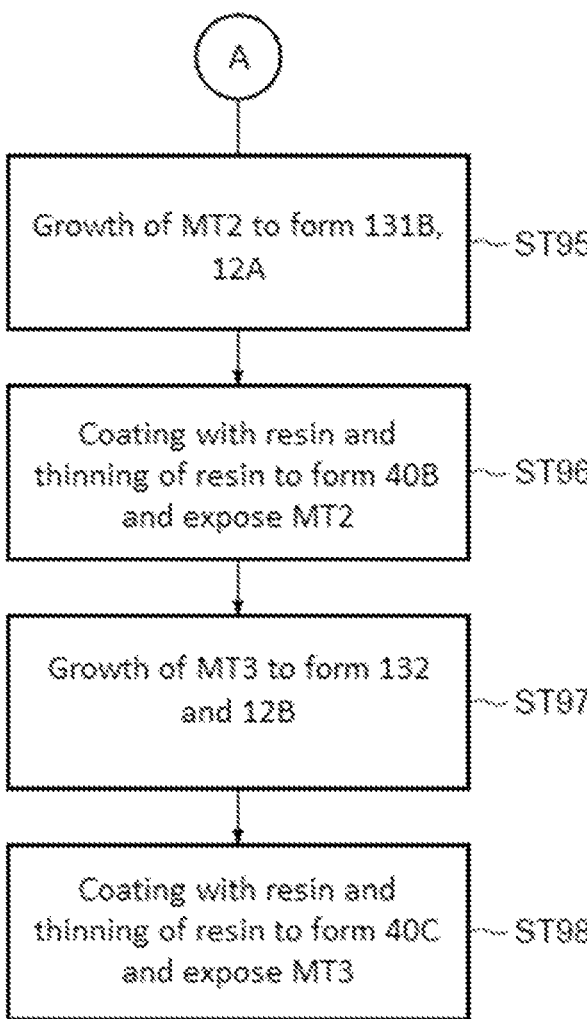

Reference will now be made in particular to FIGS. 8 to 10 to describe an implementation of an alternative embodiment of the method, which in particular allows the device DIS1 in FIG. 7 to be obtained.

As mentioned hereinabove, the formation of the carrier substrate 3A, the formation of the embedding material 40 surrounding the chip and the formation of the waveguide 10 of the device DIS1 comprise using a manufacturing technology of the molded integrated substrate (MIS) type including: steps of growing metal on molding resin-type layers; steps of covering the metal layers thus formed with other molding resin-type layers, which can have identical or different compositions; steps of thinning these other molding resin-type layers; and optionally repeating, one or more times, at least some of these steps.

Generally speaking, the metal growth steps can be carried out by copper electroplating (or optionally by electroless copper plating).

In the case of a molding resin, the molding resin can firstly be prepared as a viscous material with the compositional elements chosen in view of the function of the resin. This is followed by the deposition of a preliminary layer of resin, which can be carried out, for example, by injecting the viscous resin at 171° C. with a transfer pressure of 8 MPa and a pressure on the element to be coated of 350 kN.

This heating leads to a solidification of the resin and this solidification is completed by placing the resin in an oven at 175° C., for example, for 2 hours. The desired molding resin is thus obtained.

The resin layer can be thinned, for example, by chemical-mechanical polishing.

As shown more particularly in FIG. 9, the manufacture of the device firstly includes forming the carrier substrate 3A in a step ST90.

This formation of the carrier substrate 3A firstly includes electrolytic growth of metal on a temporary carrier so as to form contacts for electrical connection of the future carrier substrate 3A to the outside.

It is then covered with resin, and the resin is thinned to recover the contacts.

These steps are repeated, as described hereinabove, to form the successive via and metal levels, as well as the dielectric layers embedding the via levels and separating the metal levels.

The metal level M2 is then grown on the bottom resin layer 300 and the resin layer 300 is formed on the metal level M2.

The metal level M1 is then grown on the underlying resin layer 300.

The metal level M1 is then covered with molding resin, which is then thinned to form the molding resin parts 400 surrounding the antenna element 50 (FIG. 8) and expose the metal level M1.

In a step ST91, the chip 2 is turned over and connected to tracks of the metal level M1, including the track connected to the antenna element 50.

Then, in the step ST92, the chip 2 is embedded using molding resin, which is then thinned to form the embedding material 40 (FIG. 8) and expose the rear face 21 of the chip 2.

In a step ST93, a metal level MT1 (FIG. 8) is then grown to form the waveguide parts 131A, 111 and 112.

This metal level MT1 thus formed is then covered with resin (step ST94) which is thinned to form the part 40A (FIG. 8) of the molding resin and expose the metal level MT1.

In the step ST95 (FIG. 10), a metal level MT2 is then grown to form the waveguide parts 131B and 12A (FIG. 8).

Then, again, in a step ST96, the metal level MT2 is coated with molding resin which is thinned to form the parts 40B of the dielectric material of the waveguide and expose the metal level MT2.

In the step ST97, a metal level MT3 is grown to form the waveguide parts 132 and 12B.

The metal level MT3 is then coated with resin, which is thinned to form the region 40C of the dielectric resin of the waveguide and expose the metal level MT3.

The temporary carrier mentioned hereinabove is then removed.

The invention claimed is:

1. An integrated electronic device, comprising:

a waveguide having a first input/output and a second input/output, said waveguide configured to guide a radio frequency wave from the first input/output to the second input/output or from the second input/output to the first input/output;

a carrier substrate including a patch antenna system;

an electronic integrated circuit chip including a front face electrically connected to a metal level of the carrier substrate;

an electrically insulating embedding material surrounding said electronic integrated circuit chip, the electrically insulating embedding material disposed between the patch antenna system and the first input/output of the waveguide, wherein the patch antenna system is at least in contact with said electrically insulating embedding material;

wherein the electronic integrated circuit chip is configured to electrically cooperate with the patch antenna module for transmission by the patch antenna system of said radio frequency wave to the first input/output through the embedding material; and wherein the electronic integrated circuit chip is further configured to process an electrical signal from the patch antenna system in response to patch antenna system receipt of the radio frequency wave output by the first input/output via the embedding material.

2. The device according to claim 1, wherein a thickness of the electrically insulating embedding material is chosen according to a frequency of the radio frequency wave.

3. The device according to claim 1, wherein the waveguide comprises an element fixed at least to said electrically insulating embedding material.

4. The device according to claim 3, wherein:

the electrically insulating embedding material forms an embedding layer having a top face onto which a first metal part of the waveguide including the first input/output is fixed;

the electronic integrated circuit chip has a rear face located in a same plane as the top face of the embedding layer; and the waveguide includes a second metal part fixed onto the rear face of the electronic integrated circuit chip.

5. The device according to claim 1, wherein:

the carrier substrate is a laminate substrate including a stack of a plurality of metal levels separated by dielectric layers;

the electronic integrated circuit chip is connected to a first metal level located the closest to the electrically insulating embedding material; and the patch antenna system includes an antenna element located on the first metal level facing the first input/output of the waveguide and electrically connected to the electronic integrated circuit chip by a metal track.

6. The device according to claim 1, wherein:

the carrier substrate is of the molded integrated substrate type, including a stack of metal levels separated by dielectric layers of the molding resin type, the stack including a top level, to which the electronic integrated circuit chip is connected;

the patch antenna system includes an antenna element located on the top metal level facing the first input/output of the waveguide and electrically connected to the electronic integrated circuit chip by a metal track;

the electrically insulating embedding material is also of the molding resin type and embeds the electronic integrated circuit chip with the exception of a rear face opposite the front face; and the waveguide includes a first metal part including the first input/output and in contact with the electrically insulating embedding material, a second metal part in contact with the rear face of the electronic integrated circuit chip, and an inner volume containing a dielectric material also of the molding resin type.

7. The device according to claim 1, configured for transmitting/receiving the radio frequency wave having a frequency above 50 GHz.

8. A method for manufacturing an integrated electronic device, comprising:

forming a carrier substrate including a stack of metal levels separated by dielectric layers and a patch antenna system;

electrically connecting a front face of an electronic integrated circuit chip to a metal level of the carrier substrate;

electrically connecting the electronic integrated circuit chip with the patch antenna system;

forming an electrically insulating embedding material surrounding the electronic integrated circuit chip;

forming a waveguide having a first input/output and a second input/output, said waveguide configured for receiving/outputting a radio frequency wave from/to the patch antenna system via the embedding material disposed between the patch antenna system and the first input/output of the waveguide, and for guiding said radio frequency wave from the first input/output to the second input/output or from the second input/output to the first input/output.

9. The method according to claim 8, wherein the thickness of the electrically insulating embedding material is chosen according to the frequency of the radio frequency wave.

10. The method according to claim 9, wherein the frequency of the radio frequency wave is greater than or equal to 50 GHz.

11. The method according to claim 8, further comprising fixing the waveguide at least onto said electrically insulating embedding material.

12. The method according to claim 11, wherein:

the electronic integrated circuit chip has a rear face opposite the front face;

forming the electrically insulating embedding material comprises forming a layer of embedding material having a top face that lies in the same plane as the rear face of the electronic integrated circuit chip; and forming the waveguide comprises fixing, onto the top face of the layer of the embedding material, a first metal part of the waveguide including the first input/output, and fixing, onto the rear face of the electronic integrated circuit chip, a second metal part of the waveguide.

13. The method according to claim 8, wherein:

the carrier substrate is a laminate substrate, and the electronic integrated circuit chip is connected to a first metal level located the closest to the electrically insulating embedding material; and the patch antenna system includes an antenna element located on the first metal level facing the first input/output of the waveguide, and the antenna element is electrically connected to the electronic integrated circuit chip by a metal track.

14. The method according to claim 8, wherein forming the carrier substrate, forming the electrically insulating embedding material surrounding the electronic integrated circuit chip and forming the waveguide comprise using a manufacturing technology of a molded integrated substrate type including:

steps of growing metal on molding resin-type layers;

steps of covering the metal layers thus formed with other molding resin-type layers;

steps of thinning these other molding resin-type layers; and optionally repeating, one or more times, at least some of these steps.

15. The method according to claim 14, wherein:

forming the carrier substrate comprises forming the stack of metal levels separated by dielectric layers of the molding resin type, the stack including a top metal level to which the front face of the electronic integrated circuit chip is connected;

the patch antenna system includes an antenna element located on the top metal level facing the first input/output of the waveguide, and the antenna element is electrically connected to the electronic integrated circuit chip by a metal track;

forming the electrically insulating embedding material includes surrounding the electronic integrated circuit chip with a material that is also of the molding resin type, with the exception of the rear face of the electronic integrated circuit chip opposite the front face thereof; and forming the waveguide includes forming a first metal part including the second input/output and in contact with the electrically insulating embedding material, a second metal part in contact with the rear face of the electronic integrated circuit chip, and forming, within an inner volume of the waveguide, a dielectric material also of the molding resin type.

16. An integrated electronic device, comprising:

a carrier substrate including a metal track and an electrical patch antenna;

a passivation layer covering the electrical patch antenna and including an opening at the metal track;

an electronic integrated circuit chip having a front face mounted in said opening to the metal track of the carrier substrate;

a layer of encapsulating material which covers the passivation layer and embeds the electronic integrated circuit chip with the exception of a rear face of the electronic integrated circuit chip, said layer of encapsulation material having an upper surface that is coplanar with the rear face of the electronic integrated circuit chip;

a waveguide mounted to the coplanar upper surface of the layer of encapsulating material and rear face of the electronic integrated circuit chip;

said waveguide having a first input/output and a second input/output, and configured to guide a radio frequency wave from the first input/output to the second input/output or from the second input/output to the first input/output;

wherein the patch antenna and the first input/output are configured to cooperate for transmission of said radio frequency wave through the layer of encapsulating material.

17. The device of claim 16, wherein the waveguide includes a metal part in contact with the rear face of the electronic integrated circuit chip.

\* \* \* \* \*